(12) United States Patent
Su

(10) Patent No.: US 11,860,229 B2
(45) Date of Patent: Jan. 2, 2024

(54) DEVICE INTERFACE BOARD SUPPORTING DEVICES WITH MULTIPLE DIFFERENT STANDARDS TO INTERFACE WITH THE SAME SOCKET

(71) Applicant: Advantest Corporation, Tokyo (JP)

(72) Inventor: Mei-Mei Su, San Jose, CA (US)

(73) Assignee: Advantest Corporation, Tokyo (JP)

( * ) Notice: Subject to any disclaimer, the term of this patent is extended or adjusted under 35 U.S.C. 154(b) by 313 days.

(21) Appl. No.: 17/193,818

(22) Filed: Mar. 5, 2021

(65) Prior Publication Data

US 2021/0278462 A1 Sep. 9, 2021

Related U.S. Application Data

(60) Provisional application No. 62/985,514, filed on Mar. 5, 2020.

(51) Int. Cl.
*G01R 31/319* (2006.01)

(52) U.S. Cl.
CPC . *G01R 31/31926* (2013.01); *G01R 31/31905* (2013.01); *G01R 31/31907* (2013.01)

(58) Field of Classification Search
None
See application file for complete search history.

(56) References Cited

U.S. PATENT DOCUMENTS

| | | | |
|---|---|---|---|
| 2006/0100814 A1 | 5/2006 | Repko et al. | |
| 2007/0261009 A1* | 11/2007 | Granicher | G01R 1/07385 |
| | | | 324/755.07 |
| 2018/0196103 A1 | 7/2018 | Champoux et al. | |
| 2018/0259572 A1 | 9/2018 | Su | |
| 2018/0267101 A1* | 9/2018 | Champoux | G01R 35/00 |
| 2018/0313891 A1 | 11/2018 | Nahum et al. | |
| 2019/0277907 A1 | 9/2019 | Wolff et al. | |

OTHER PUBLICATIONS

McRobert, "What You Need to Know About U.3"—(Quarch/McRobert)—(Apr. 2019) (Year: 2019).*
"Speedster22i_DDR3_User_Guide_UG031"—(Achronix)—(Nov. 2018) (Year: 2018).*

* cited by examiner

*Primary Examiner* — April Y Blair
*Assistant Examiner* — Matthew W Wahlin

(57) ABSTRACT

An automated test equipment (ATE) apparatus comprising a tester processor operable to generate commands and data for coordinating testing of a plurality of devices under test (DUTs). The ATE further comprises a field programmable gate array (FPGA) communicatively coupled to the tester processor, wherein the FPGA comprises routing logic operable to route signals associated with the commands and data in the FPGA based on a type of the device under test (DUT). Further, the ATE comprises a connector module communicatively coupled to the FPGA comprising a socket to which the DUT connects and further comprising circuitry for routing the signals to a set of pins on the DUT, wherein the set of pins are associated with a first type of DUT. The circuitry can support multiple different DUT types having a common form factor but different pinout assignments.

18 Claims, 8 Drawing Sheets

DEVICE INTERFACE BOARD SUPPORTING DEVICES WITH MULTIPLE DIFFERENT STANDARDS TO INTERFACE WITH THE SAME SOCKET

CROSS-REFERENCE TO RELATED APPLICATIONS

This application also claims priority to U.S. Provisional Application 62/985,514 titled "Device Interface Board with Support for Multiple Different Form Factor DUTs with No Change in Hardware,", filed on Mar. 5, 1920. The entire contents of each of the above-listed applications is hereby incorporated by reference for all purposes as if fully set forth herein.

FIELD OF THE INVENTION

The present disclosure relates generally to the field of electronic device testing systems and more specifically to the field of electronic device testing equipment for testing devices under test (DUTs).

BACKGROUND OF THE INVENTION

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

FIG. 1 is a schematic block diagram for one type of conventional automatic test equipment (ATE) body 100 for testing certain typical DUTs e.g. a semiconductor memory device such as a DRAM. The ATE includes an ATE body 100 with hardware bus adapter sockets 110A-110N. Hardware bus adapter cards 110A-110N specific to a particular communication protocol e.g. PCIe, USB, SATA, SAS etc. connect to the hardware bus adapter sockets provided on the ATE body and interface with the DUTs via cables specific to the respective protocol. The ATE body 100 also includes a tester processor 101 with an associated memory 108 to control the hardware components built into the ATE body 100 and to generate the commands and data necessary to communicate with the DUTs being tested through the hardware bus adapter cards. The tester processor 101 communicates with the hardware bus adapter cards over system bus 130. The tester processor may be programmed to include certain functional blocks including a pattern generator 102 and a comparator 106. Alternatively, the pattern generator 102 and comparator 106 may be hardware components mounted on an expansion or adapter card that plug into the ATE body 100.

The ATE body 100 tests the electrical functions of the DUTs 112A-112N connected to the ATE body 100 through hardware bus adapters plugged into the hardware bus adapter sockets of the ATE body 100. Accordingly, the tester processor 101 is programmed to communicate the test programs needed to be run to the DUTs using the protocol unique to the hardware bus adapters. Meanwhile, the other hardware components built into the ATE body 100 communicate signals with each other and with the DUTs according to test programs operating in the tester processor 101.

The test program run by the tester processor 101 may include a function test which involves writing input signals created by the pattern generator 102 to the DUTs, reading out the written signals from the DUTs and using the comparator 106 to compare the output with the expected patterns. If the output does not match the input, the tester processor 101 will identify the DUT as being defective. For example, if the DUT is a memory device such as a DRAM, the test program will write data generated by the pattern generator 102 to the DUT using a Write Operation, read data from the DRAM using a Read Operation and compare the expected bit pattern with the read pattern using the comparator 106.

In conventional systems, the tester processor 101 needs to contain the functional logic blocks to generate the commands and test patterns used in testing the DUTs, such as the pattern generator 102 and the comparator 106, programmed in software directly on the processor. However, in some instances certain functional blocks such as the comparator 106 may be implemented on a field programmable gate array (FPGA), which is an application specific integrated circuit (ASIC) type semiconductor device that can program logic circuits according to a user's demand.

The FPGAs used in conventional systems may be pass-through devices that rely on the tester processor 101 to transfer the commands and test patterns to the FPGA, which the FPGA in turn relays over to the DUTs. Because the tester processor, and not the FPGA, is responsible for generating the commands and test patterns, the number and type of DUTs that can be tested with a given ATE body is limited by the processing capabilities and programming of the tester processor. Where the tester processor generates all the commands and test patterns, bandwidth constraints on the system bus 130 connecting the tester processor to the various hardware components, including any FPGA devices and hardware bus adapter sockets, also places an upper limit on the number of DUTs that can tested simultaneously.

Also, in conventional systems, the communication protocol used to communicate with the DUTs is fixed because the hardware bus adapter cards that plug into the ATE body 100 are single purpose devices that are designed to communicate in only one protocol and cannot be reprogrammed to communicate in a different protocol. For example, an ATE body configured to test PCIe devices will have hardware bus adapter cards plugged into the body that support only the PCIe protocol. In order to test DUTs supporting a different protocol, e.g., SATA the user would ordinarily need to replace the PCIe hardware bus adapter cards with bus adapter cards supporting the SATA protocol. Unless the PCIe hardware bus adapter cards are physically substituted with cards supporting the other protocol, such a system can only test DUTs that support the PCIe protocol.

Additionally, in conventional systems, the hardware bus adapter cards would need to be swapped to support devices having multiple different standards. For example, a U.2 solid-state drive could not be connected to the same socket to interface with a tester system as a U.3 solid-state drive. The sockets would need to be replaced or a hardware bus adapters would need to be used to interface devices associated with different standards to a universal device interface board. A more streamlined approach is needed.

BRIEF SUMMARY OF THE INVENTION

Accordingly, a need exists for a test architecture whereby devices supporting different standards (e.g., U.2 or U.3 computer interface standards for connecting solid-state drives to a computer) can be plugged into the same socket in a tester system without changing hardware or requiring a special purpose hardware bus adapter.

Further, a need exists for a tester architecture that can address the problems with the systems described above. What is needed is a test architecture whereby the command and test pattern generation functionality can be transferred onto the FPGA, so that the processing load on the tester processor and the bandwidth requirements on the system bus can be kept at a minimum. This would be more efficient than prior configurations where the tester processor bore the entire processing load and the system bus conveyed test data and commands for all the DUTs connected to the ATE body.

In one embodiment, an automated test equipment (ATE) system is disclosed. The ATE comprises a system controller communicatively coupled to a tester processor, wherein the system controller is operable to transmit instructions to the tester processor. Further, the ATE comprises an FPGA communicatively coupled to the tester processor, wherein the FPGA is operable to internally generate commands and data transparently from the tester processor for testing a DUT, and wherein the FPGA comprises routing logic operable to route signals associated with the commands and data in the FPGA based on a type of the DUT. The ATE also comprises a connector module communicatively coupled to the FPGA comprising a socket to which the DUT connects and further comprising circuitry for routing the signals to a set of pins on the DUT, wherein the set of pins are associated with the type of the DUT. In one embodiment, the type of DUT can either be a U.2 type DUT or a U.3 interface standard DUT.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

Figure 1:
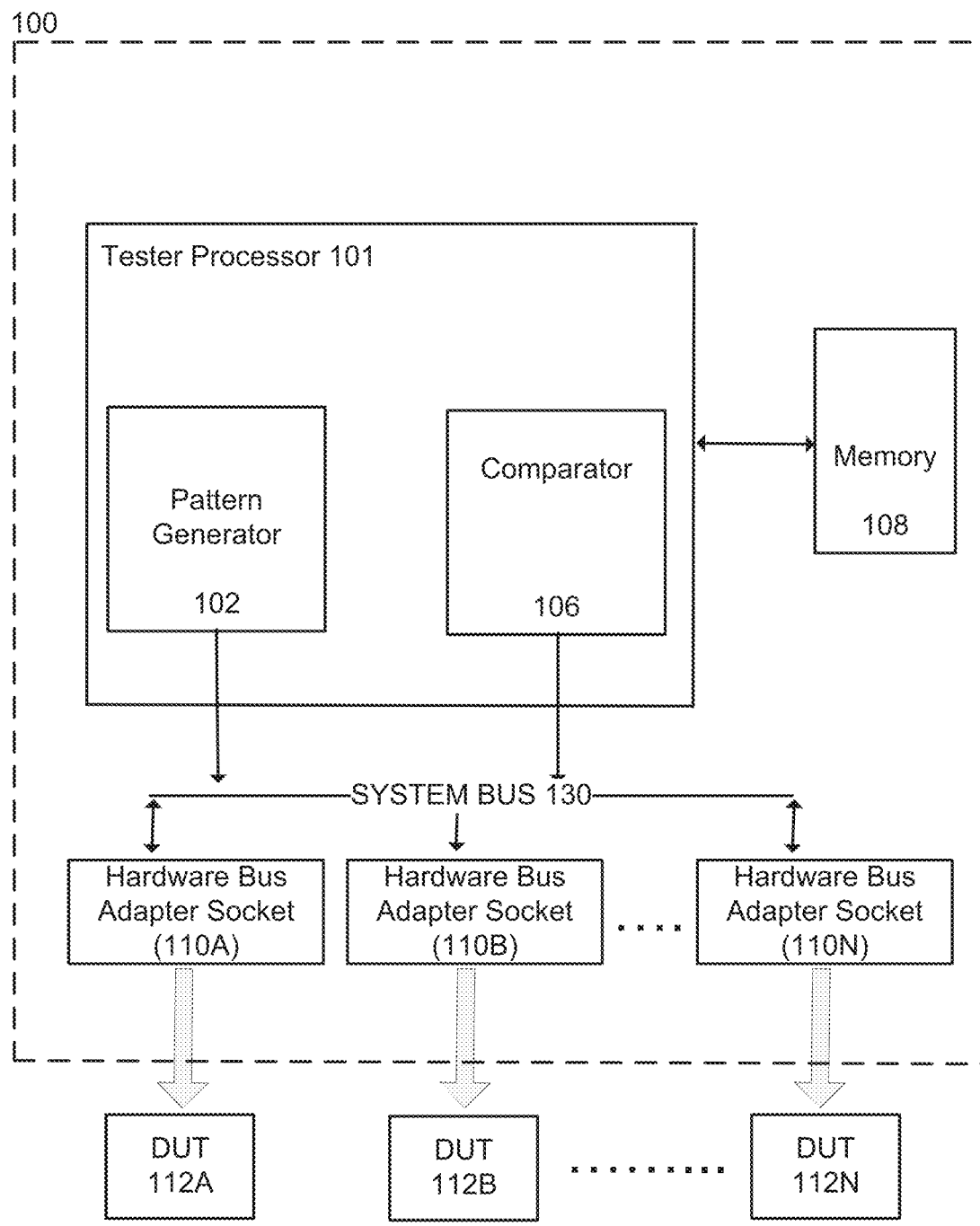
FIG. 1 is a schematic block diagram of a conventional automatic test equipment body for testing a typical device under test (DUT).

In the figures, elements having the same designation have the same or similar function.

DETAILED DESCRIPTION OF THE INVENTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

NOTATION AND NOMENCLATURE SECTION

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "testing," "communicating," "coupling," "converting," "relaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The description below provides a discussion of computers and other devices that may include one or more modules. As used herein, the term "module" or "block" may be understood to refer to software, firmware, hardware, and/or various combinations thereof. It is noted that the blocks and modules are exemplary. The blocks or modules may be combined, integrated, separated, and/or duplicated to support various applications. Also, a function described herein as being performed at a particular module or block may be performed at one or more other modules or blocks and/or by one or more other devices instead of or in addition to the function performed at the described particular module or block. Further, the modules or blocks may be implemented across multiple devices and/or other components local or remote to one another. Additionally, the modules or blocks may be moved from one device and added to another device, and/or may be included in both devices. Any software implementations of the present invention may be tangibly embodied in one or more storage media, such as, for example, a memory device, a floppy disk, a compact disk (CD), a digital versatile disk (DVD), or other devices that may store computer code.

The terminology used herein is for the purpose of describing particular embodiments only and is not intended to limit the scope of the present invention. As used throughout this disclosure, the singular forms "a," "an," and "the" include plural reference unless the context clearly dictates otherwise. Thus, for example, a reference to "a module" includes a plurality of such modules, as well as a single module, and equivalents thereof known to those skilled in the art.

Device Interface Board Supporting Devices with Multiple Different Standards to Interface with the Same Socket Test throughput can be usually be improved in a number of ways. One way to decrease the testing time of DUTs is by transferring functionality formerly performed in software on a general-purpose tester processor to hardware accelerators implemented on FPGA devices. Another way is by increasing the number and types of devices under test (DUTs) that can be tested under prevailing hardware and time constraints, for example, by configuring the hardware so that DUTs supporting many different interface standards, e.g., U.2, U.3, etc. can be tested with the same hardware (e.g., using the same connectors on a device interface board (DIB)) without needing to replace or reconfigure any hardware components. Embodiments of the present invention are directed to so improving test efficiency in the hardware of the automatic test equipment.

Figure 2:
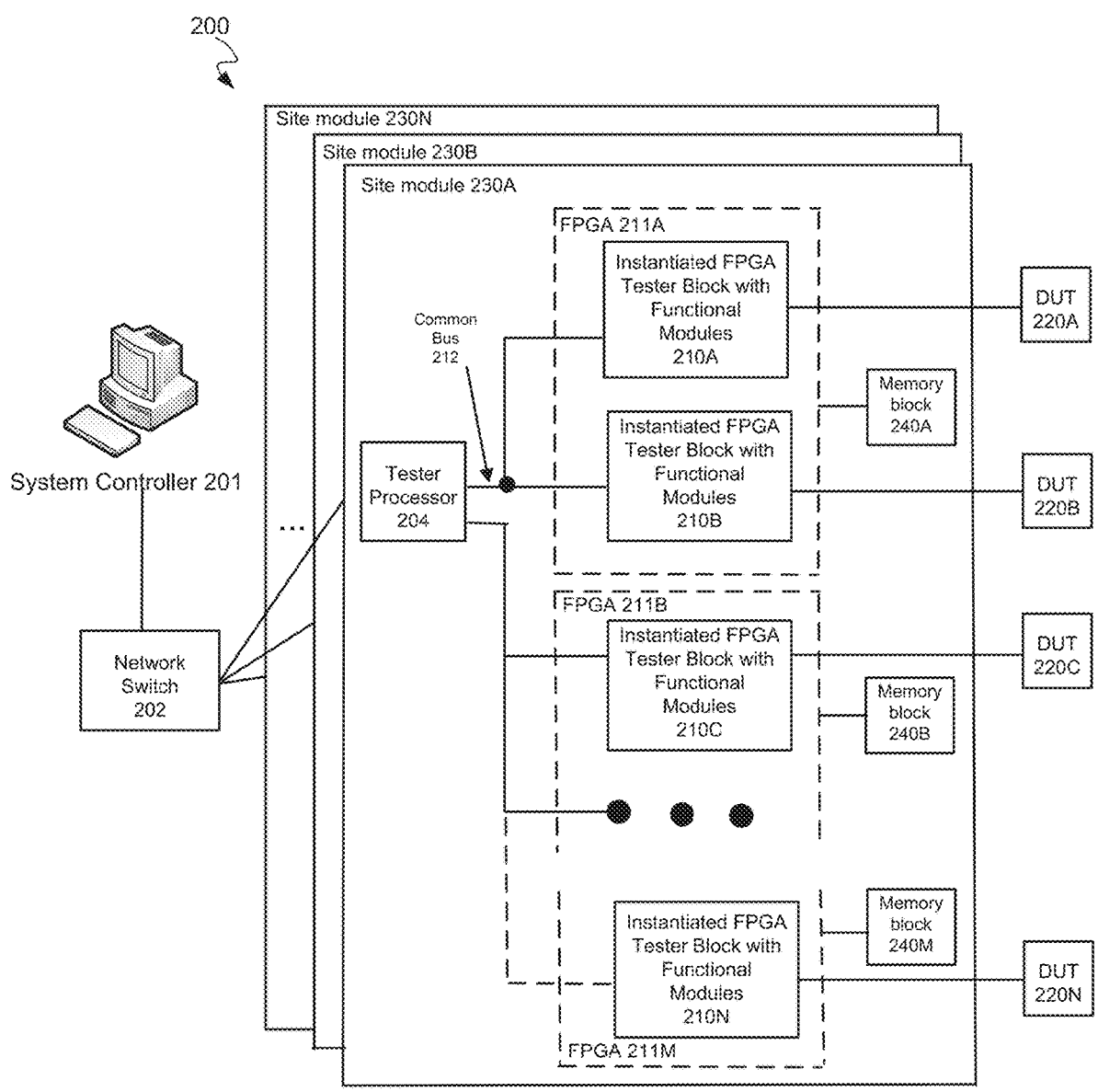
FIG. 2 is a high level schematic block diagram of the interconnections between the system controller, the site modules and the DUTs according to one embodiment of the present invention.

FIG. 2 is an exemplary high level block diagram of the automatic test equipment (ATE) apparatus 200 in which a tester processor is connected to the devices under test (DUTs) through FPGA devices with built-in functional modules in accordance with an embodiment of the present invention. In one embodiment, ATE apparatus 200 may be implemented within any testing system capable of testing multiple DUTs simultaneously. For example, in one embodiment, apparatus 200 may be implemented inside a primitive as shown in FIG. 10.

Referring to FIG. 2, an ATE apparatus 200 for testing semiconductor devices more efficiently in accordance with an embodiment of the present invention includes a system controller 201, a network switch 202 connecting the system controller to the site module boards 230A-230N, FPGA devices 211A-211M comprising instantiated FPGA tester blocks 210A-210N, memory block modules 240A-240M wherein each of the memory blocks is connected to one of the FPGA devices 211A-211M, and the devices under test (DUTs) 220A-220N, wherein each device under test 220A-220N is connected to one of the instantiated FPGA tester blocks 210A-210N.

In one embodiment, the system controller 201 may be a computer system, e.g., a personal computer (PC) that provides a user interface for the user of the ATE to load the test programs and run tests for the DUTs connected to the ATE 200. The Verigy Stylus Operating System is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 512 DUTs.

In one embodiment, the system controller 201 can be connected to the site module boards 230A-230N through a network switch, such as an Ethernet switch. In other embodiments, the network switch may be compatible with a different protocol such as Fibre Channel, 802.11 or ATM, for instance.

In one embodiment, each of the site module boards 230A-230N may be a separate standalone board used for purposes of evaluation and development that attaches to custom-built load board fixtures, on which the DUTs 220A-220N are loaded, and also to the system controller 201 from where the test programs are received. In other embodiments, the site module boards may be implemented as plug-in expansion cards or as daughter boards that plug into the chassis of the system controller 201 directly. Alternatively, the site module boards may be housed within an enclosure of a primitive (as shown in FIG. 10) and may connect to the various DUTs using a device interface board (DIB).

In one implementation, the site module boards 230A-230N can each comprise at least one tester processor 204 and at least one FPGA device. The tester processor 204 and the FPGA devices 211A-211M on the site module board run the test methods for each test case in accordance with the test program instructions received from the system controller 201. In one embodiment the tester processor can be a commercially available Intel 8086 CPU or any other well-known processor. Further, the tester processor may be operating on the Ubuntu OS x64 operating system and running the Core Software, which allows it to communicate with the Stylus software running on the system controller, to run the test methods. The tester processor 204 controls the FPGA devices on the site module and the DUTs connected to the site module based on the test program received from the system controller.

The tester processor 204 is connected to and can communicate with the FPGA devices over bus 212. In one embodiment, tester processor 204 communicates with each of the FPGA devices 211A-211M over a separate dedicated bus. In one embodiment, tester processor 204 can control the testing of the DUTs 220A-220N transparently through the FPGAs with minimal processing functionality allocated to the FPGA devices. In this implementation, the FPGA devices act as pass-through devices. In this embodiment, the data traffic capacity of bus 212 can be exhausted rapidly because all the commands and data generated by the tester processor need to be communicated over the bus to the FPGA devices. In other embodiments, the tester processor 204 can share the processing load by allocating functionality to control the testing of the DUTs to the FPGA devices. In these embodiments, the traffic over bus 212 is reduced because the FPGA devices can generate their own commands and data.

In one embodiment, each of the FPGA devices 211A-211M is connected to its own dedicated memory block 240A-240M. These memory blocks can, among other things, be utilized to store the test pattern data that is written out to the DUTs. In one embodiment, each of the FPGA devices can comprise two instantiated FPGA tester blocks 210A-210B with functional modules for performing functions including implementation of communicative protocol engines and hardware accelerators as described further herein. Memory blocks 240A-240 M can each contain one or more memory modules, wherein each memory module within the memory block can be dedicated to one or more of the instantiated FPGA tester blocks 210A-210B. Accordingly, each of the instantiated FPGA tester blocks 210A-210B can be connected to its own dedicated memory module within memory block 240A. In another embodiment, instantiated FPGA tester blocks 210A and 210B can share one of the memory modules within memory block 240A.

Further, each of the DUTs 220A-220N in the system can be connected to a dedicated instantiated FPGA tester block 210A-210N in a "tester per DUT" configuration, wherein each DUT gets its own tester block. This allows separate test execution for each DUT. The hardware resources in such a configuration are designed in a manner to support individual DUTs with minimal hardware sharing. This configuration also allows many DUTs to be tested in parallel, where each DUT can be connected to its own dedicated FPGA tester block and be running a different test program. In one implementation, two or more DUTs may also be connected to each FPGA tester block (e.g., block 210A).

The architecture of the embodiment of the present invention depicted in FIG. 2 has several advantages. First, it allows the communication protocol modules to be programmed directly on the instantiated FPGA tester blocks within the FPGA devices. The instantiated tester blocks can be configured to communicate with the DUTs in any protocols that the DUTs support. Accordingly, if DUTs with different protocol support need to be tested, they can be connected to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 201 without any kind of hardware interactions. An FPGA will typically include a configurable interface core (or IP core) that is programmable to provide functionality of one or more protocol based interfaces for a DUT and is programmable to interface with the DUT. For example, the FPGAs 211A-211M in the ATE apparatus 200 will include an interface core that can be configured with the PCIe protocol to test PCIe devices initially and subsequently reconfigured via a software download to test SATA devices. Also, if a new protocol is released, the FPGAs can easily be configured with that protocol via a bit-stream download. Finally, if a non-standard protocol needs to be implemented, the FPGAs can nonetheless be configured to implement such a protocol.

In another embodiment, the FPGAs 211A-211M can be configured to run more than one communicative protocol, wherein these protocols also can be downloaded from system controller 201 and configured through software. In other words, each FPGA implements custom firmware and software images to implement the functionality of one or more PC based testers in a single chip. The required electrical signaling and protocol-based signaling is provided by on-chip IP cores in the FPGAs. As mentioned above, each FPGA is programmable with pre-verified interface or IP cores. This ensures compliance and compatibility according to a given interface standard. The programmable nature of the FPGA is utilized to optimize flexibility, cost, parallelism and upgradeability for storage testing applications from SSDs, HDDs and other protocol based storage devices.

For instance, instantiated FPGA tester block 210A can be configured to run the PCIe protocol while instantiated FPGA tester block 210B can be configured to run the SATA protocol. This allows the tester hardware to test DUTs supporting different protocols simultaneously. FPGA 211A can now be connected to test a DUT that supports both PCIe and SATA protocols. Alternatively, it can be connected to test two different DUTs, one DUT supporting the PCIe protocol and the other DUT supporting the SATA protocol, where each instantiated functional module (e.g., 210A, 210B) is configured with a protocol to test the respective DUT it is connect to.

In one embodiment, the interface or IP core in the FPGA may be acquired from a third party vendor but may require some customization to be compatible with the embodiments described herein. In one embodiment, the interface core provides two functions: a) wraps storage commands into a standard protocol for transmission over a physical channel; and 2) is the electrical signal generator and receiver.

The other major advantage of the architecture presented in FIG. 2 is that it reduces processing load on the tester processor 204 by distributing the command and test pattern generating functionality to FPGA devices, where each DUT has a dedicated FPGA module running the test program specific to it. For instance, instantiated FPGA tester block 210A is connected to DUT 220A and runs test programs specific to DUT 220A. The hardware resources in such a configuration are designed in a manner to support individual DUTs with minimal hardware sharing. This "tester per DUT" configuration also allows more DUTs to be tested per processor and more DUTs to be tested in parallel. Furthermore, with the FPGAs capable of generating their own commands and test patterns in certain modes, the bandwidth requirements on bus 212 connecting the tester processor with the other hardware components, including FPGA devices, device power supplies (DPS) and DUTs, is also reduced. As a result more DUTs can be tested simultaneously than in prior configurations.

Figure 3:
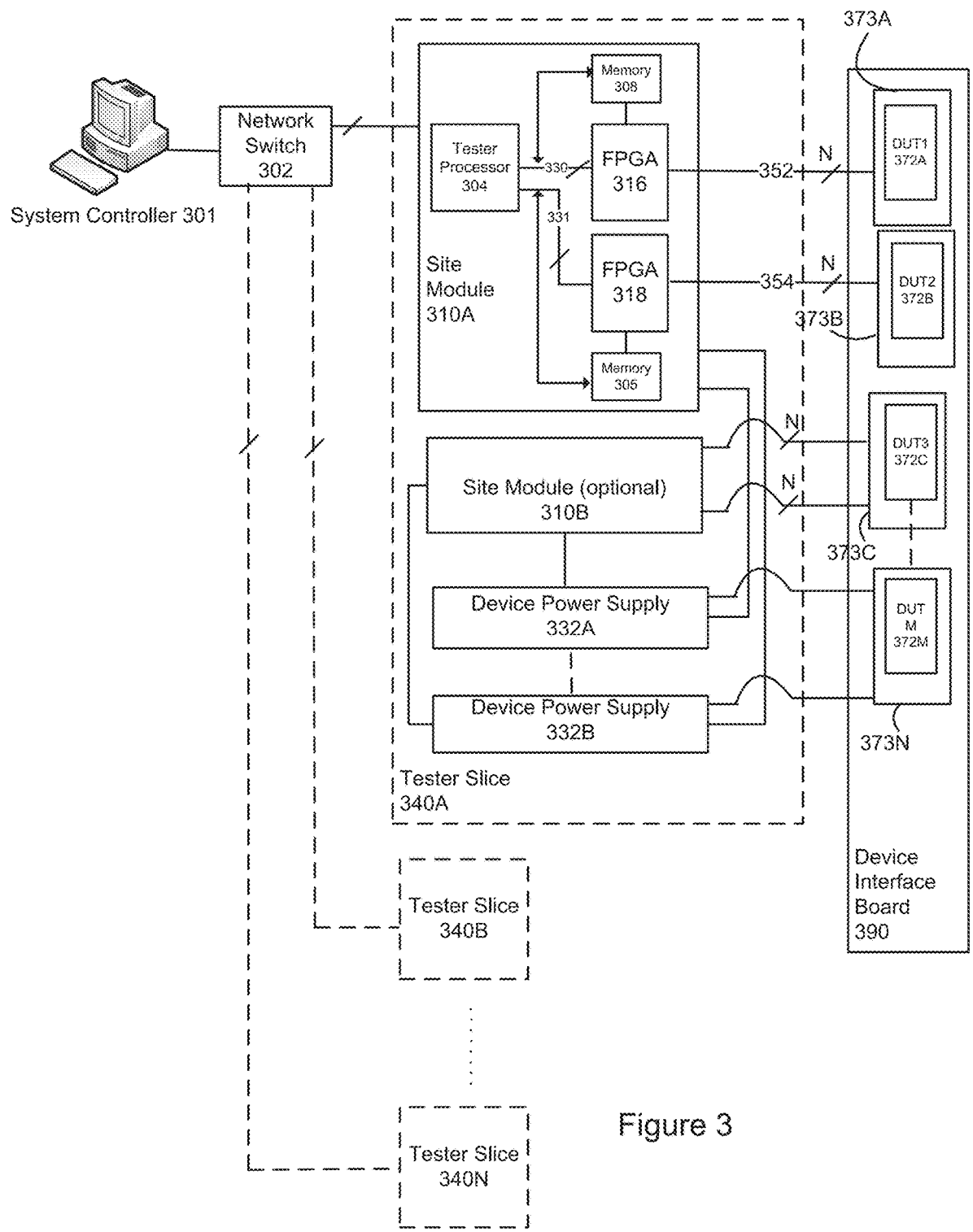
FIG. 3 is a detailed schematic block diagram of the site module and its interconnections with the system controller and the DUTs according to an embodiment of the present invention.

FIG. 3 provides a more detailed schematic block diagram of the site module and its interconnections with the system controller and the DUTs that connect to sockets on a device interface board (DIB) in accordance with an embodiment of the present invention. Referring to FIG. 3, the site modules of the ATE apparatus, in one embodiment, can be mechanically configured onto tester slices 340A-340N, wherein each tester slice comprises at least one site module. In certain typical embodiments, each tester slice can comprise two site modules and two device power supply boards. Tester slice 340A of FIG. 3, for example, comprises site modules 310A and 310B and device power supply boards 332A and 332B. However, there is no limit to the number of device power supply boards or site modules that can be configured onto a tester slice. Tester slice 340 is connected to system controller 301 through network switch 302. System controller 301 and network switch 302 perform the same function as elements 201 and 202 in FIG. 2 respectively. Network switch 302 can be connected to each of the site modules with a 32 bit wide bus.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe), Serial AT Attachment (SATA) or Serial Attached SCSI (SAS), for instance.

In one embodiment, each site module is configured with two FPGAs as shown in FIG. 3. Each of the FPGAs 316 and 318 in the embodiment of FIG. 3. is controlled by the tester processor 304 and performs a similar function to FPGAs 211A-211M in FIG. 2. The tester processor 304 can communicate with each of the FPGAs using a 8 lane high speed serial protocol interface such as PCIe as indicated by system buses 330 and 331 in FIG. 3. In other embodiments, the tester processor 304 could also communicate with the FPGAs using different high speed serial protocols, e.g., Serial AT Attachment (SATA) or Serial Attached SCSI (SAS).

FPGAs 316 and 318 are connected to memory modules 308 and 305 respectively, where the memory modules perform a similar function to memory blocks 240A-240N in FIG. 2. The memory modules are coupled with and can be controlled by both the FPGA devices and the tester processor 304. In one embodiment, the DUTs 372A-372M derive power from the device power supplies 332A and 332B.

FPGAs 316 and 318 can be connected to the DUTs 372A-372M using connector modules 373A-373N on a DIB 390 through lanes 352 and 354 respectively. The DIB comprises connector modules 373A-373N that enables the DUTs to interface with the FPGAs on the tester slices. As will be explained in connection with FIG. 4 and FIG. 11, the connector modules may comprise sockets, lane change modules, multiplexers and other logic circuitry. In one embodiment, the connector modules enable DUTs supporting different computer interface standards (e.g., U.2 and U.3 solid-state drives) to connect with the same socket on the DIB 390. In other words, the additional circuitry on the connector modules is configured so that DUTs associated with different interfaces may be able to use the same hardware to connect to the DIB 390 and interface with the site module boards (including the FPGA).

For example, U.2 (also known as SFF-8639) is a computer interface standard for connecting solid-state drives (SSDs) to a computer (e.g., a tester system). It was designed to be used with PCIe drives along with SAS and SATA drives. It uses up to four PCIe lanes and two SATA lanes. A U.2 SSD is a high-performance data storage device designed to support the Peripheral Component Interconnect Express (PCIe) interface using a small form factor (SFF) connector that is also compatible with standard SAS and SATA-based spinning disks and solid-state drives (SSDs). The U.3 standard builds on the U.2 standard, but comprises a different pinout than the U.2 standard. For example, it combines SAS, SATA and NVMe support into a single controller. DUTs that support the U.2 and the U.3 standard may have the same form factor, but the pinouts may be quite different.

In one embodiment, connector modules 373A-373N enable DUTs to advantageously connect to the tester without needing to change or re-configure the hardware. In other words, both U.2 or U.3 DUTs may be plugged into the sockets on DIB 390 (without requiring additional hardware bus adapter cards or other modifications to the hardware). The circuitry on the connector modules 373A-373N combined with the firmware and software support on the FPGAs (e.g., FPGAs 316 and 318) allows both U.2 and U.3 DUTs to connected to the same socket on the DIB 390 and communicate with the tester system without hardware reconfiguration.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and lanes 352 and 354 can each be 32 bits wide, however, more or less can be implemented depending on the application. If each DUT requires 8 I/O lanes, for example, only 4 DUTs can be connected to each FPGA in such a system.

Figure 4:
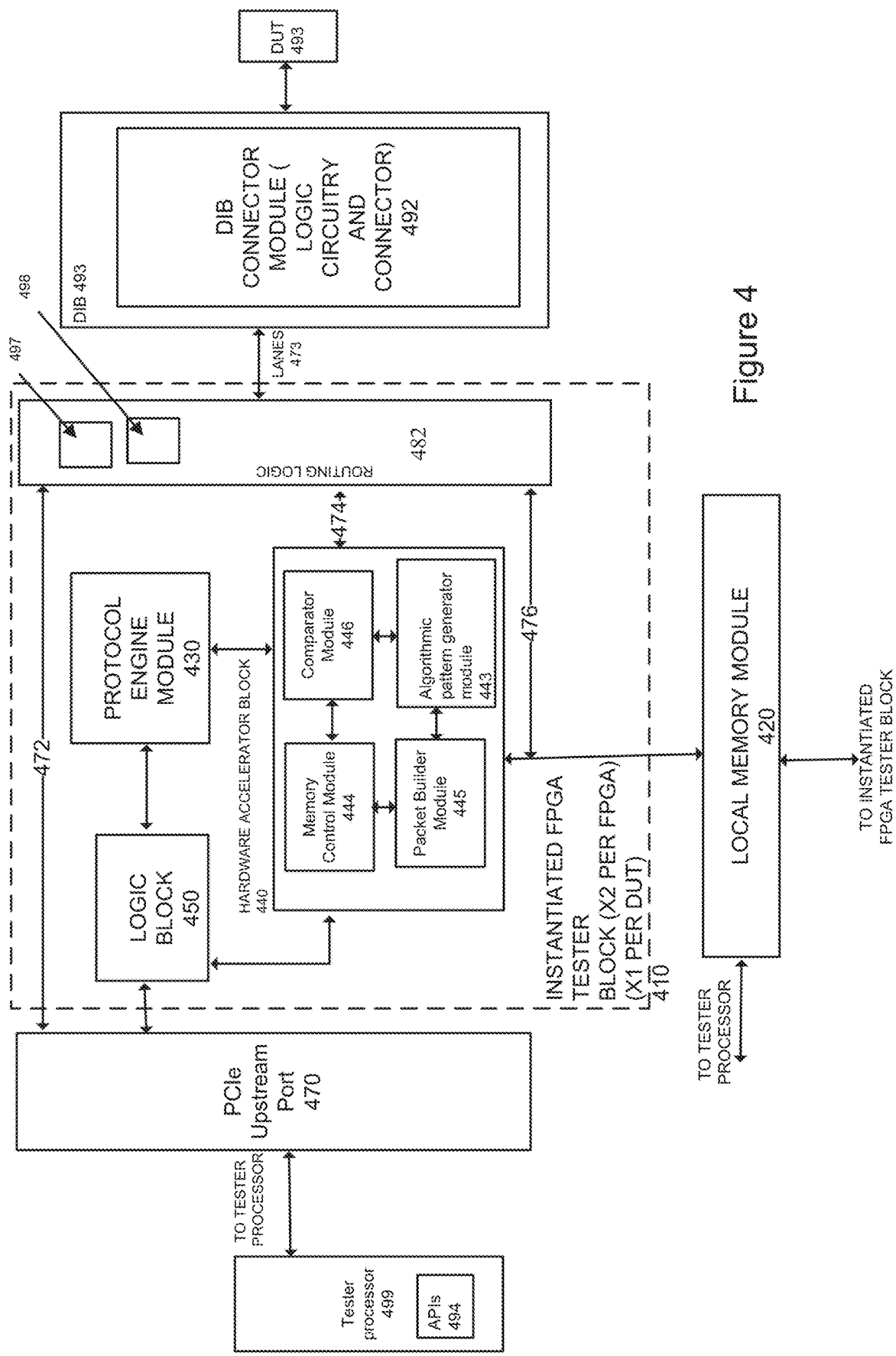
FIG. 4 is a detailed schematic block diagram of the instantiated FPGA tester block of FIG. 2 according to an embodiment of the present invention.

FIG. 4 is a detailed schematic block diagram of an instantiated FPGA tester block of FIG. 2 according to an embodiment of the present invention. Referring to FIG. 4, the instantiated FPGA tester block 410 is connected to the tester processor 499 through PCIe upstream port 470 and to the DUT through PCIe downstream port 480.

Instantiated FPGA block 410 can comprise a protocol engine module 430, a logic block module 450, and a hardware accelerator block 440. The hardware accelerator block 440 can further comprise a memory control module 444, comparator module 446, a packet builder module 445, and an algorithmic pattern generator (APG) module 443.

In one embodiment, logic block module 450 comprises decode logic to decode the commands from the tester processor 499, routing logic to route all the incoming commands and data from the tester processor 499 and the data generated by the FPGA devices to the appropriate modules, and arbitration logic to arbitrate between the various communication paths within instantiated FPGA tester block 410.

In one implementation, the communication protocol used to communicate between the tester processor 499 and the DUTs can advantageously be reconfigurable. The communicative protocol engine in such an implementation is programmed directly into the protocol engine module 430 of instantiated FPGA tester block 410. The instantiated FPGA tester block 410 can therefore be configured to communicate with the DUTs in any protocol that the DUTs support. The pre-verified interface or IP cores mentioned above, for example, can be programmed into the protocol engine module 430. This ensures compliance and compatibility according to a given interface standard. Further, the IP core allows the tester to achieve flexibility in that the IP core enables software-based changing of interfaces. Embodiments provide an ability to test multiple types of DUTs independent of the hardware. With such interface flexibility, new interfaces may be loaded into the IP core of a programmable chip.

In one embodiment, an FPGA may be an SSD module-based tester that uses protocol-based communications to interface with a DUT or module. In one embodiment, the configurable interface core may be programmed to provide any standardized protocol-based communications interface. For example, in one embodiment, in the case of an SSD module-base test, the interface core may be programmed to provide standardized protocol-based communications interfaces such as SATA, SAS, etc.

Accordingly, from an electrical perspective, the FPGAs utilize a configurable IP core. Enabled by software programming of the programmable chip resources of an FPGA, a given IP core may be easily reprogrammed and replaced with another IP core without physically swapping out the FPGA chip or other hardware components. For example, if a given FPGA-based tester currently supports SATA, all that would be required to be able to connect to a fibre channel DUT is for the FPGA to be reprogrammed to use a fibre channel IP core instead of the existing IP core configured for SATA.

In one embodiment, the protocols can be high speed serial protocols, including but not limited to SATA, SAS or PCIe, etc. The new or modified protocols can be downloaded and installed directly on the FPGAs via a simple bit-stream download from the system controller through the tester processor. Also, if a new protocol is released, the FPGAs can easily be re-configured with that protocol via a software download.

In FIG. 4, if the DUT 493 is a PCIe device, a bit-file containing the instantiation of the PCIe protocol can be downloaded through the PCIe upstream port 470 and installed in the IP core on the protocol engine module 430. Each FPGA device 316 or 318 can comprise one or more instantiated FPGA tester block and, consequently, one or more protocol engine modules. The number of protocol engine modules that any one FPGA device can support is limited only by the size and gate count of the FPGA.

In one embodiment of the present invention, each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol and the other DUT supporting the SATA protocol.

The hardware accelerator block 440 of FIG. 4 can be used to expedite certain functions on FPGA hardware than would be possible to do in software on the tester processor. The hardware accelerator block 440 can supply the initial test pattern data used in testing the DUTs. It can also contain functionality to generate certain commands used to control the testing of the DUTs. To generate test pattern data, accelerator block 440 uses the algorithmic pattern generator module 443.

The hardware accelerator block 440 can use comparator module 446 to compare the data being read from the DUTs to the data that was written to the DUTs in a prior cycle. The comparator module 446 comprises functionality to flag a mismatch to the tester processor 304 to identify devices that are not in compliance. More specifically, the comparator module 446 can comprise an error counter that tracks the mismatches and communicates them to the tester processor 304.

Hardware accelerator block 440 can connect to a local memory module 420. Memory module 420 performs a similar function to a memory module within any of the memory blocks 240A-240M. Memory module 420 can be controlled by both the hardware accelerator block 440 and the tester processor 304. The tester processor 304 can control the local memory module 420 and write the initial test pattern data to it.

The memory module 420 stores the test pattern data to be written to the DUTs and the hardware accelerator block 440 accesses it to compare the data stored to the data read from the DUTs after the write cycle. The local memory module 420 can also be used to log failures. The memory module would store a log file with a record of all the failures the DUTs experienced during testing. In one embodiment, the accelerator block 440 has a dedicated local memory module block 420 that is not accessible by any other instantiated FPGA tester blocks. In another embodiment, the local memory module block 420 is shared with a hardware accelerator block in another instantiated FPGA tester block.

Hardware accelerator block 440 can also comprise a memory control module 444. The memory control module 444 interacts with and controls read and write access to the memory module 420. Finally, hardware accelerator block 440 comprises a packet builder module 445. The packet builder module is used by the hardware accelerator block in certain modes to construct packets to be written out to the DUTs comprising header/command data and test pattern data.

In certain embodiments, hardware accelerator block 440 can be programmed by the tester processor 304 to operate in one of several modes of hardware acceleration. In bypass mode, the hardware accelerator is bypassed and commands and test data are sent by the tester processor 304 directly to the DUT through path 472. In hardware accelerator pattern generator mode, test pattern data is generated by the APG module 443 while the commands are generated by the tester processor 304. The test packets are transmitted to the DUT through path 474. In hardware accelerator memory mode, the test pattern data is accessed from local memory module 420 while the commands are generated by the tester processor 304. The test pattern data is transmitted to the DUT through path 476. In full accelerator mode the FPGA tester block 410 generates both the commands and the data for testing the DUT 493.

In one embodiment, routing logic module 482 comprises the logic circuitry to swap lanes 473 so that DUTs supporting different interface standards (e.g., U.2, U.3, etc.) can be tested using the same hardware. The routing logic module 482 is implemented on the instantiated FPGA tester block 410 and works in conjunction with the logic circuitry on DIB connector module 492 (implemented on DIB 493) to advantageously reroute the lanes 473 so that both U.2 and U.3 DUTs can be connected to the same hardware. As will be explained further in connection with FIG. 11, DIB connector module 492 comprises multiplexers, lane change modules, and additional circuitry that enables pins on the connector associated with the connector module 492 to be re-routed so that both U.2 and U.3 type DUTs can be supported.

In one embodiment, routing logic 482 may comprise a "lane swizzle" module 497 and a "lane mask" module 498 that enables the lane remapping between, for example, U.2 and U.3 type devices as will be explained further in connection with FIG. 6. Further, in one embodiment, API modules 494 may be implemented on the tester processor 499 that control the switches (e.g., multiplexers, lane change modules, etc.) on the DIB connector module 492 and also control the firmware modules 497 and 498 implemented in the routing logic module 482 within the FPGA.

Routing logic 482 is needed to arbitrate between paths 472, 474 and 476 to control the flow of data to the DUT. As noted above, routing logic 482 can also be used to perform the mapping between the lanes 473 so that DUTs supporting different interface standards can be used with the connector module 492.

Figure 5:
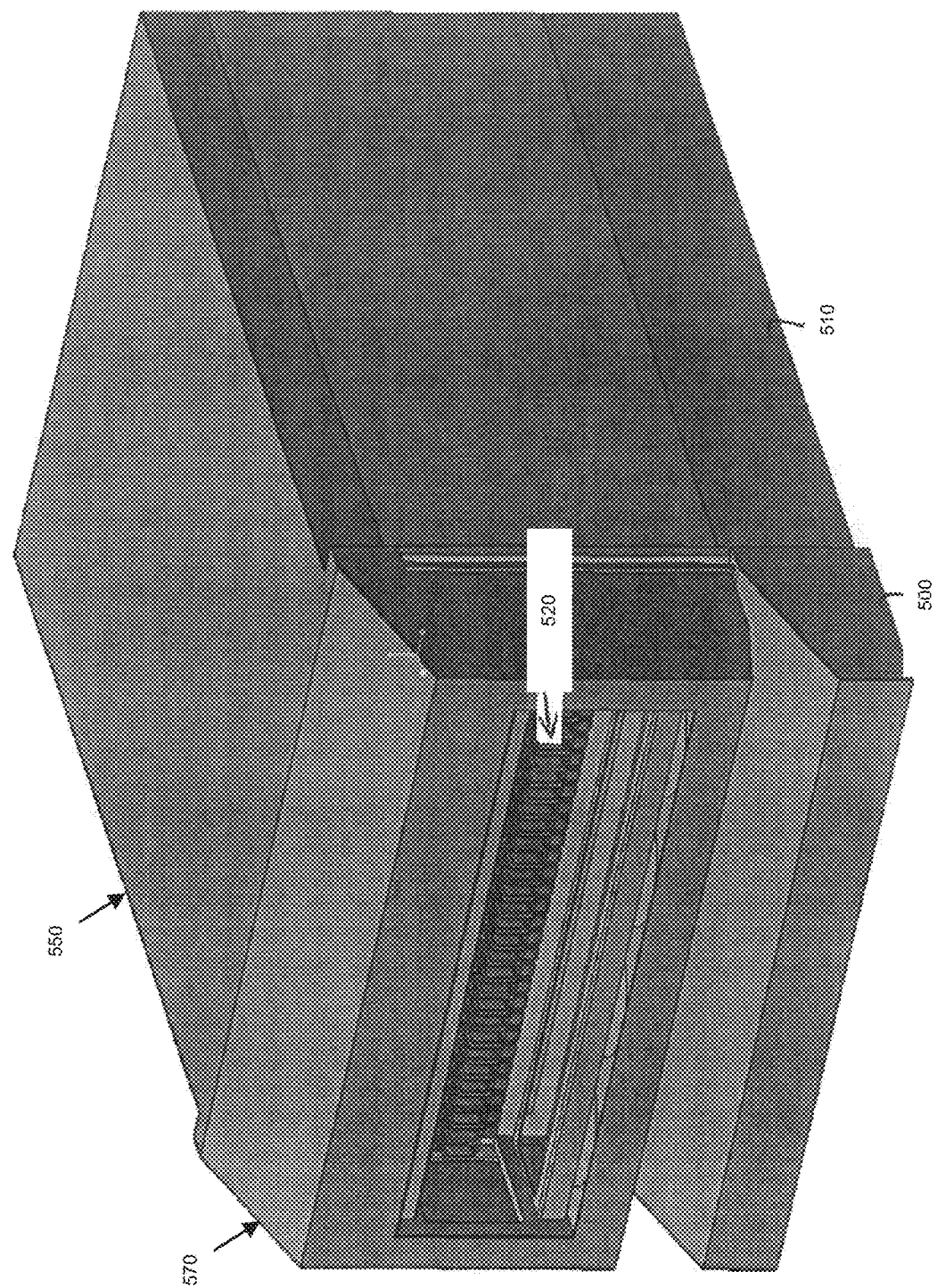
FIG. 5 illustrates a primitive interfaced with a Device Interface Board (DIB) in accordance with an embodiment of the invention.

FIG. 5 illustrates a primitive 510 interfaced with a Device Interface Board (DIB) 500 in accordance with an embodiment of the invention. In one embodiment, primitive 510 may be connected to and used to test primarily SSD drives. Similar to the tester slice (e.g., 340A, etc.) shown in FIG. 3, the primitive of FIG. 5 is a type of discrete test module that fits into a test head and comprises the test circuitry, which performs tests on the DUTs in accordance with a test plan. A primitive comprises an enclosure 550 within which all the various electronics, e.g., site modules, power supplies, etc. are housed. The DIB 500 can connect with a plurality of DUTs 520 using sockets sized for the DUTs 520. The DUTs connect to sockets within the DIB 500 to physically and electronically interface to the DIB 500. Conventional DIBs typically do not contain sockets that allow swapping of DUTs supporting different interface standards. Embodiments of the present invention provide connector modules that advantageously allow DUTs supporting different interface standards (e.g., U.2 and U.3 devices) to be swapped out without reconfiguring the hardware.

The primitive can also comprise an enclosure 570. The DIB 500 can, in one embodiment, interface to a universal backplane (not shown) of the primitive 510 through a load board (not shown). The primitive 510 contains test circuitry for performing a test plan on the DUTs 520. The primitive 510 can operate independently of any other primitive and is connected to a control server (similar to system controller 301 shown in FIG. 3).

Figure 6:
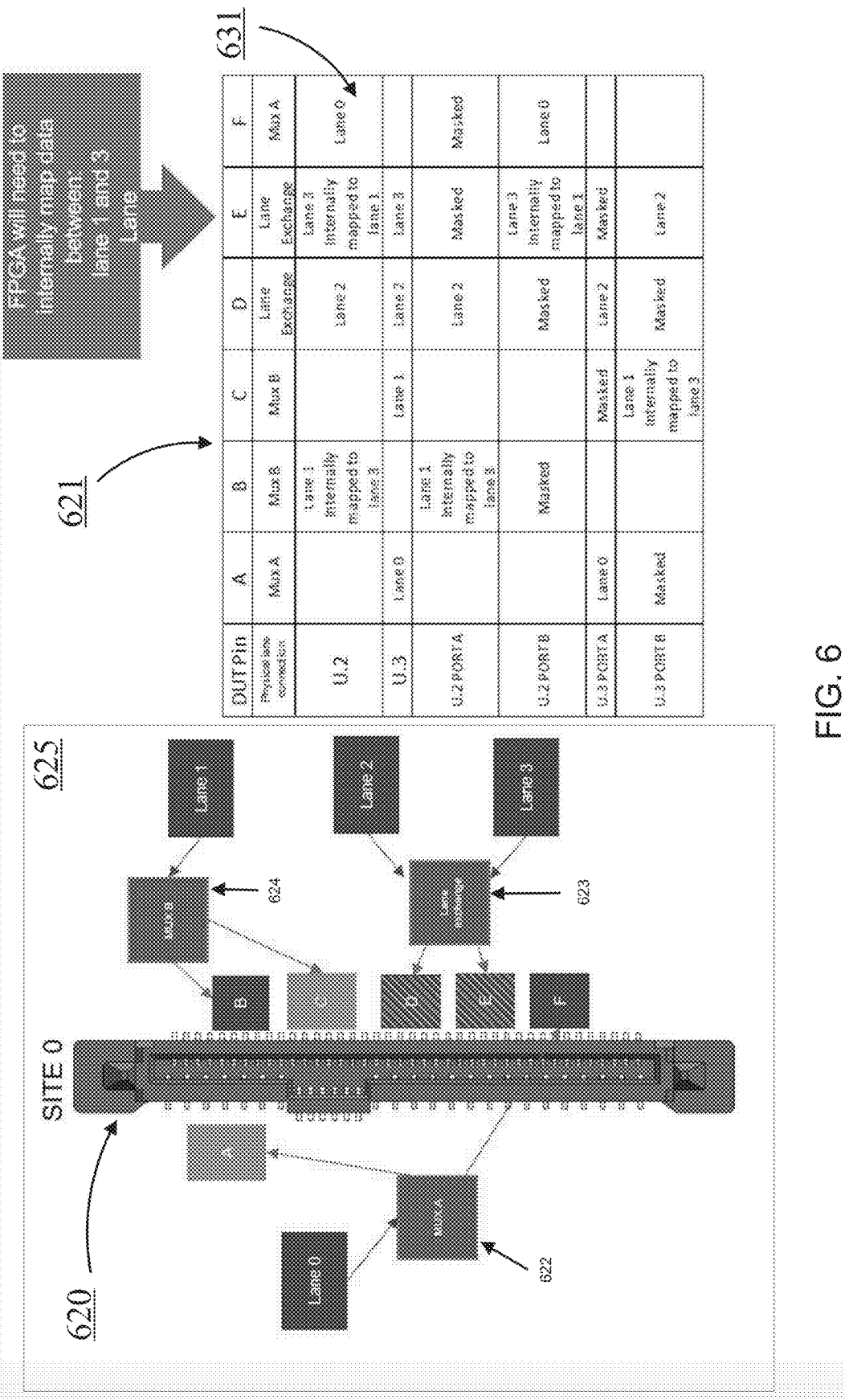
FIG. 6 illustrates the manner in which a device interface board can be advantageously configured so that devices supporting multiple different standards can interface with the same socket in accordance with an embodiment of the invention without hardware changes.

FIG. 6 illustrates the manner in which a device interface board (DIB) can be configured so that devices supporting multiple different standards can interface with the same socket on the DIB in accordance with an embodiment of the invention. Specifically, FIG. 6 illustrates the manner in which a connector module 625 (which performs substantially the same function as connector module 373A in FIG. 3 and connector module 492 in FIG. 4) on a DIB is configured to allow both U.2 and U.3 devices to connect to a socket on the DUT and interface with the tester system seamlessly without requiring any hardware modifications.

As mentioned previously, in prior ATE systems, if the pin out of the DUT was different, the interface board or load board through which communication would take place between a tester system and a DUT would need to be swapped out and replaced with a different hardware design. For example, U.3 DUTs would require a unique device interface board (DIB) as compared to U.2 DUTs even though the form factor of the DUTs is the same because U.3 DUTs differ in pinout configuration from U.2 DUTs.

Embodiments of the present invention implement a connector module 625 on a device interface board (DIB) that supports testing both U.3 and U.2 DUTs without requiring any change in hardware. The DIB includes a universal socket 620 into which DUTs supporting implementing different interface standards (e.g., U.2, U.3, etc.) may be plugged. The socket 620 comprises pins A, B, C, D, E and F that can be re-mapped to different lanes (e.g., lanes 0, 1, 2, 3 and 4) depending on the type of device connected to the socket 620. Note that lanes 0, 1, 2, 3 and 4 may be comprised within lanes 473 shown in FIG. 4. The connector module 625, in one embodiment, enables on-the-fly pin-out reconfiguration. In this fashion, the same socket on the same DIB can be advantageously reused to test different types of DUTs.

Although the same socket 620 is used, the DUT pin-out can be re-mapped so that a single DIB can be used to test different types of DUTs, e.g., U.3 or U.2 DUT types. Therefore, two different device types can be operated on the same DIB using the same hardware. Further, the pin-out can be advantageously configured by user selection during runtime since no hardware changes are required.

On the hardware side in the DIB, the hardware allows signals to be re-routed to advantageously support the different pin-outs between the different interface standard DUTs used. In one embodiment, the connector module 625 comprises at least a multiplexer A 622, a multiplexer B 624, a lane exchange module 623 and a connector 620. In combination, the firmware logic on the FPGA (e.g., firmware logic implemented on routing logic 482 on FPGA tester block 410 in FIG. 4), software implemented on the tester processor (e.g., APIs 494 implemented on tester processor 499), the multiplexers (e.g. multiplexers 622 and 624) and the lane exchange module 623 together are able to re-route lanes (e.g., lane 1, lane 2, lane 3, and lane 0) that comprise the interface between the connector 620 and the tester system so that both U.2 and U.3 type DUTs can be tested using the same connector. In other words, the connector module 625 allows lanes to be re-mapped so that signals are directed to the appropriate pins on the connector 620 depending on the pinout of the respective DUT plugged into the connector 620. In one embodiment, the connector module 625 is configured to advantageously use the least amount of multiplexers to perform the mapping.

Table 621 illustrates the manner in which the pins on connector 620 may be mapped based on the type of device in accordance with an embodiment of the present invention. The columns of Table 621 correspond to each of the pins A, B, C, D, E, and F on the connector 620. The rows correspond to the interface standards that may be implemented using the connector 620, e.g., U.2 single port, U.3 single port, U.2 Port A, U.2 Port B, U.3 Port A and U.3 Port B. U.2 Port A and U.2 Port B implement the dual port U.2 standard. U.3 Port A and U.3 Port B implement the dual port U.3 standard. Row 631 in Table 621 indicates the physical module (e.g., multiplexer A 622, a multiplexer B 624, a lane exchange module 623) to which a corresponding pin is connected.

Each cell in Table 621 indicates the manner in which the corresponding pin needs to be mapped in order to implement the corresponding standard. For example, to implement the U.2 standard, lane 1 is internally mapped to lane 3 in connection with Pin B and lane 3 is internally mapped to lane 1 in connection with Pin E. Embodiments of the present invention are able to use the mapping shown in Table 621 to map between the different pinouts of U.2 and U.3 type devices.

Figure 7:
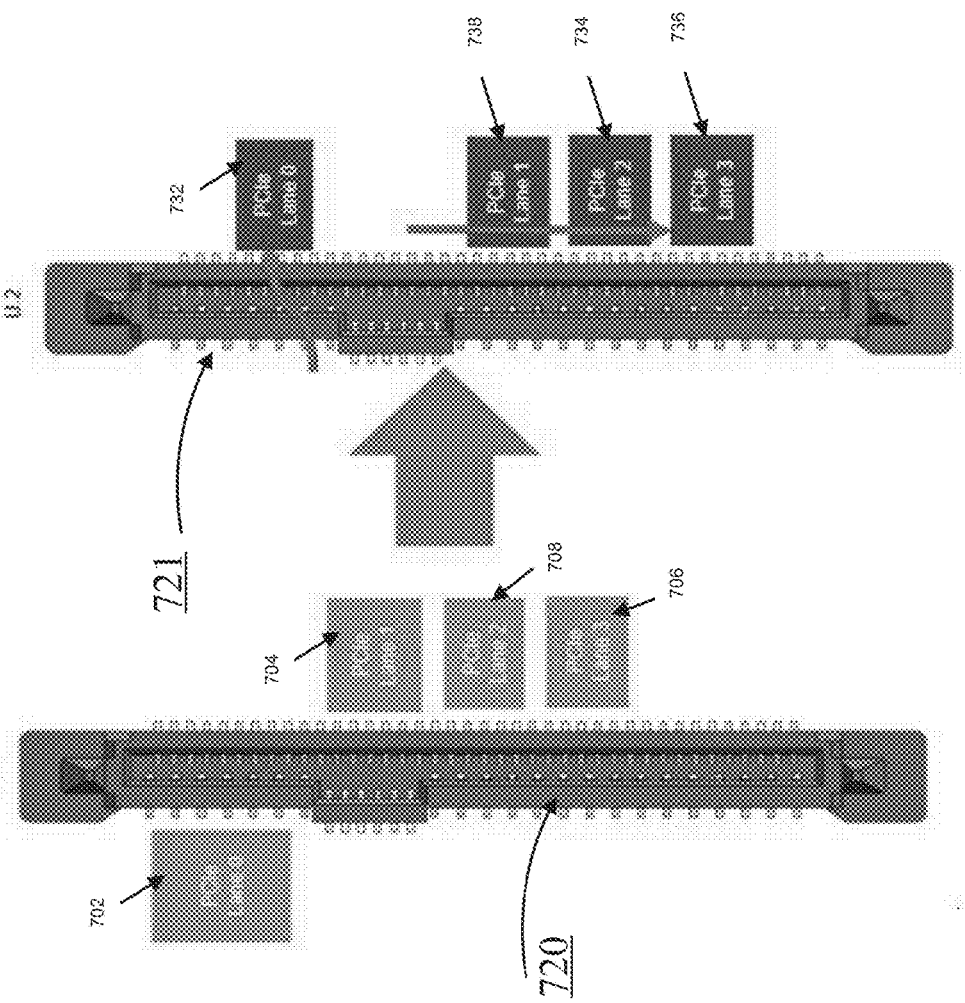
FIG. 7 illustrates the manner in which a pinouts for U.2 and U.3 devices can be mapped to each other in accordance with an embodiment of the invention.

FIG. 7 illustrates the manner in which pinouts for U.2 and U.3 devices can be mapped to each other in accordance with an embodiment of the invention. As shown in FIG. 7, the four lanes (lane 0, lane 1, lane 2 and lane 3) are physically connected to the appropriate pins for either the U.2 or U.3 specification on the DIB. The pins on socket 720 to which the lanes (lane 0 702, lane 1 704, lane 2 708 and lane 4 706) connect for a U.3 device are different from the pins on the socket 721 to which the same lanes (lane 0 732, lane 1 738, lane 2 734 and lane 3 736) connect for a U.2 device. To support both standards, all four lanes will typically need to be remapped. In order to convert a U.3 connection into a U.2 connection, Lane 0 702 needs to be moved to U.2's Lane 0 732 pins. Further, Lane 1 704 needs to be moved to U.2's Lane 1 738 pins. Lane 2 708 needs to be moved to U.2's Lane 2 734 pins. Also, Lane 3 706 needs to be moved to U.2's Lane 3 736 pins. As seen in FIG. 7, with a U.2 DIB, there are no physical connections on the connector corresponding to the pins where Lane 0 and Lane 1 connect for a U.3 device. Also, with a U.3 DIB, there are no physical connections on the connector corresponding to the pins where Lane 0 and Lane 3 connect for a U.2 device.

As discussed in connection with FIG. 4, the FPGA comprises command and control logic (e.g., modules 497 and 498) configured to the test the one or more DUTs. The FPGA, in one embodiment, enables reconfiguration by rerouting signals inside the FPGA. The FPGA signal re-routing performed in firmware in combination with the DIB signal rerouting on connector module 492 is used for embodiments of the present invention to operate. As noted above, firmware logic is implemented on the routing logic module 482 of FIG. 4 so that signals can be re-routed within the FPGA so that data comes out on the appropriate channels to accommodate the different pinouts between the different types of DUTs. On the software side, APIs 494 are implemented on tester processor 499 to control this functionality by switching high-speed signal and sideband signal through the FPGA firmware and the DIB.

In one embodiment, routing logic 482 may comprise a "lane swizzle" module 497 and a "lane mask" module 498 that enables the lane remapping between, for example, U.2 and U.3 type devices. The lane swizzle module 497 logically rewires the tester lanes within the FPGA firmware to match the requirements on the connectors (e.g., connector 620 in FIG. 6). The lane mask module 498 allows lanes that are unused for a particular pinout to be masked. As seen in Table 621 of FIG. 6, certain pins corresponding to dual port configurations are masked. The "lane mask" module allows the firmware to control the masking of the associated channels.

In one embodiment, the APIs 494 implemented on tester processor 499 comprises an API to control the multiplexers and lane exchange modules on the connector module 492. Further, the APIs 494 also comprises a respective API to control each of the lane swizzle module 497 and the lane mask module 498.

Figure 8:
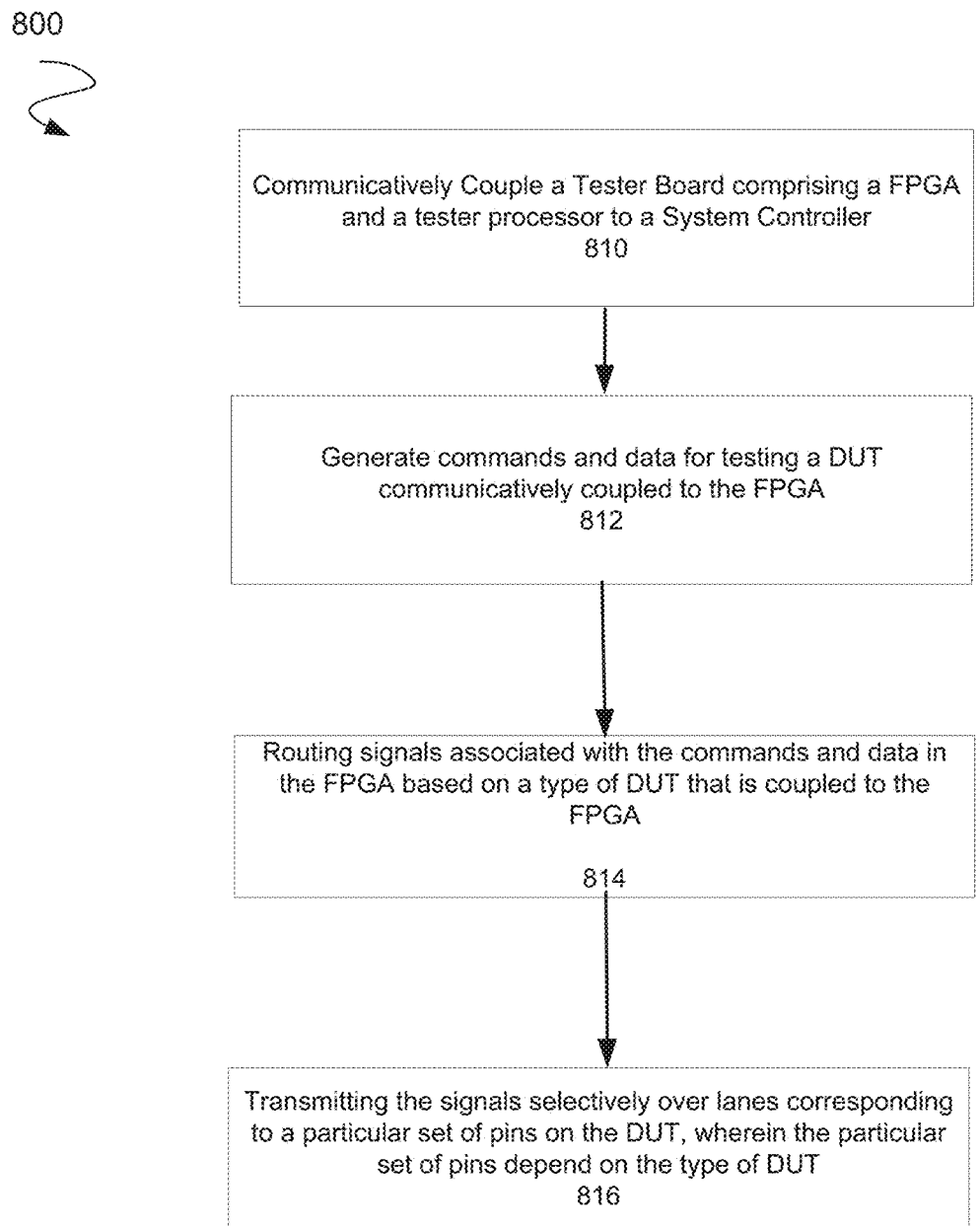
FIG. 8 depicts a flowchart of an exemplary process of testing DUTs supporting different interfaces using the same socket in a tester system according to an embodiment of the present invention.

FIG. 8 depicts a flowchart of an exemplary process of testing DUTs supporting different interfaces using the same socket in a tester system according to an embodiment of the present invention. The embodiments of the invention, however, are not limited to the description provided by flowchart 800. Rather, it will be apparent to persons skilled in the relevant art(s) from the teachings provided herein that other functional flows are within the scope and spirit of the present invention.

At block 810, a system controller is coupled to a tester processor and an FPGA. The system controller may be a Windows based operation system as discussed above. The tester processor and FPGA may be located on the same tester board or different boards. The FPGA is communicatively coupled to the tester processor and is operable to generate commands and data for testing a plurality of DUTs in accordance with one of the various acceleration modes discussed above.

At block 812, commands and data for testing a DUT are generated by the tester processor and/or the FPGA.

At block 814, signals associated with commands and data are re-routed in firmware implemented on the FPGA based on a type of the DUT (e.g., a U.2 or a U.3 type DUT) that is coupled to the FPGA.

At block 816, the re-routed signals are transmitted selectively over lanes corresponding to a particular set of pins on the DUT, wherein the particular set of pins receiving the selectively transmitted signals depends on the type of DUT.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. An automated test equipment (ATE) system comprising:
a system controller communicatively coupled to a tester processor, wherein the system controller is operable to transmit instructions to the tester processor;
a field programmable gate array (FPGA) communicatively coupled to the tester processor, wherein the FPGA is operable to internally generate commands and data transparently from the tester processor for testing a device under test (DUT), and wherein the FPGA comprises routing logic operable to route signals associated with the commands and data in the FPGA based on a physical communication interface type of the DUT; and
connection hardware operable to physically connect to different physical communication interface types implemented for devices under test (DUTs) wherein the connection hardware comprises a connector module communicatively coupled to the FPGA, wherein the connector module comprises a socket operable to receive and to connect to the DUT and circuitry for routing the signals via the socket to a set of pins on the DUT, wherein the set of pins is associated with a first physical communication interface type of DUT, wherein the connector module further comprises circuitry for re-routing the signals via the socket to a different set of pins on the DUT, wherein the different set of pins is associated with a second physical communication interface type of DUT which is different from the first physical communication interface type of DUT.

2. The ATE of claim 1, wherein the first physical communication interface type of DUT comprises a U.2 interface standard DUT.

3. The ATE of claim 1, wherein the first physical communication interface type of DUT comprises a U.3 interface standard DUT.

4. The ATE of claim 1, wherein the routing logic comprises a lane swizzle module operable to rewire lanes associated with the signals to lanes that match up with the physical communication interface type of the DUT connected to the connector module.

5. The ATE of claim 1, wherein the routing logic comprises a lane mask module operable to mask lanes associated with pins on the DUT that are unused.

6. The ATE of claim 1, wherein the circuitry for routing the signals to the set of pins on the DUT comprises at least two multiplexers and a lane exchange module.

7. The ATE of claim 1, wherein the second physical communication interface type of DUT comprises a U.3 interface standard.

8. An automated test equipment (ATE) apparatus comprising:
a tester processor operable to generate commands and data for coordinating testing of a plurality of devices under test (DUTs);
a field programmable gate array (FPGA) communicatively coupled to the tester processor, wherein the FPGA comprises routing logic operable to route signals associated with the commands and data in the FPGA based on a physical communication interface type of the DUTs; and
connection hardware operable to physically connect to different physical communication interface types implemented for the DUTs, wherein the connection hardware comprises a connector module communicatively coupled to the FPGA, wherein the connector module comprises a socket operable to receive and to connect to a device under test (DUT) of the DUTs and comprises circuitry for routing the signals via the socket to a set of pins on the DUT, wherein the set of pins is associated with a first physical communication interface type of DUT, wherein the connector module further comprises circuitry for re-routing the signals via the socket to a different set of pins on the DUT, wherein the different set of pins is associated with a second physical communication interface type of DUT.

9. The ATE of claim 8, wherein the first physical communication interface type of DUT comprises a U.2 interface standard DUT.

10. The ATE of claim 8, wherein the first physical communication interface type of DUT comprises a U.3 interface standard DUT.

11. The ATE of claim 8, wherein the circuitry for routing the signals in the connector module supports multiple different physical communication interface types having a common form factor but different pinout assignments.

12. The ATE of claim 8, wherein the circuitry for routing the signals to the set of pins on the DUT comprises at least two multiplexers and a lane exchange module.

13. A method for testing devices under test (DUTs), the method comprising:
receiving instructions from a system controller at a tester processor, wherein a tester board comprising a field programmable gate array (FPGA) and the tester processor are coupled to the system controller, and wherein the tester processor is operable to coordinate testing of a device under test (DUT);
generating commands and data for testing the DUT;
routing signals associated with the commands and the data in the FPGA based on a physical communication interface type of the DUT;
transmitting, to connection hardware operable to physically connect to different physical communication interface types implemented for the DUTs, the signals via a socket over lanes corresponding to a set of pins on the DUT, wherein the set of pins is associated with a first physical communication interface type of DUT, wherein the connection hardware comprises a connector module communicatively coupled to the FPGA, and wherein the connector module comprises the socket operable to receive and to connect to the DUT; and
for a second physical communication interface type of DUT, re-routing the signals via the socket to a different set of pins on the DUT, wherein the different set of pins is associated with the second physical communication interface type of DUT which is different from the first physical communication interface type of DUT.

14. The method of claim 13, wherein the first physical communication interface type of DUT is a U.2 interface standard DUT.

15. The method of claim 13, wherein the second physical communication interface type of DUT is a U.3 interface standard DUT.

16. The method of claim 13, wherein the routing comprises:
rewiring the signals to the lanes corresponding to the set of pins.

17. The method of claim 16, wherein the routing further comprises:
masking lanes corresponding to a particular set of pins on the DUT that are unused.

18. The method of claim 13, wherein the routing is performed by firmware programmed on the FPGA.

* * * * *